US005885476A

United States Patent [19]

Hong et al.

[11] Patent Number: 5,885,476

[45] Date of Patent: Mar. 23, 1999

[54] COMPOSITION FOR MICROETCHING COPPER OR COPPER ALLOY

[75] Inventors: Yoong-koo Hong; Toshiko Nakagawa, both of Amagasaki, Japan

[73] Assignee: MEC Co., Ltd., Amagasaki, Japan

[21] Appl. No.: 811,531

[22] Filed: Mar. 4, 1997

[30] Foreign Application Priority Data

Mar. 5, 1996 [JP] Japan .................................... 8-047585

[51] Int. Cl.[6] ............................ C09K 13/04; C09K 13/08

[52] U.S. Cl. ......................................... 252/79.2; 252/79.4

[58] Field of Search ................................. 252/79.1, 79.2, 252/79.4

[56] References Cited

U.S. PATENT DOCUMENTS

| | | | |
|---|---|---|---|
| 3,520,746 | 7/1970 | Johnson et al. | 156/14 |
| 3,736,197 | 5/1973 | Messerschmidt et al. | 156/14 |
| 4,383,857 | 5/1983 | Steeves et al. | 156/664 |
| 4,964,920 | 10/1990 | Jackson et al. | 134/3 |

FOREIGN PATENT DOCUMENTS

| | | |
|---|---|---|
| 39 41 524 | 6/1990 | Germany . |
| 4118764 | 12/1992 | Germany . |
| 51-005345 | 2/1976 | Japan . |
| 52-022192 | 2/1977 | Japan . |

OTHER PUBLICATIONS

Patent Abstracts of Japan, vol. 12, No. 306 (C–522), Aug. 19, 1988, JP–63–079983, Apr. 9, 1988.

U.S. application No. 09/116,339, filed Jul. 16. 1998.

*Primary Examiner*—Benjamin Utech
*Assistant Examiner*—George Goudreau
*Attorney, Agent, or Firm*—Oblon, Spivak, McClelland, Maier & Neustadt, P.C.

[57] ABSTRACT

A microetching composition for copper or copper alloys comprising, (a) nitric acid or sulfuric acid, or both, (b) ferric nitrate or ferric sulfate, or both, (c) at least one component selected from a group consisting of unsaturated carboxylic acids, salts of unsaturated carboxylic acid, and anhydrides of unsaturated carboxylic acid, and (d) water. The composition can produce a copper or copper alloy surface exhibiting excellent adhesion to resins such as prepregs and resists and superior solderability. The composition is suitable for the manufacture of printed wiring boards with highly integrated fine line patterns.

8 Claims, No Drawings

COMPOSITION FOR MICROETCHING COPPER OR COPPER ALLOY

BACKGROUND OF THE INVENTION

1. Field of the Invention

The present invention relates to a microetching composition useful for treating surfaces of copper or copper alloys (the copper or copper alloys may be hereinafter collectively called "copper").

2. Description of the Background Art

In the manufacture of printed wiring boards, copper surfaces are polished prior to coating such surfaces with an etching resist or a solder resist to improve adhesion of these resists to the copper surfaces. Mechanical cleaning using a buffing or scrubbing machine, or chemical cleaning, known as microetching, are used for roughening the copper surfaces. Microetching is more popular for treating substrates with fine line patterns. The copper surface is etched as deeply as 1–5 μm by the microetching treatment. This depth of etching is calculated from the weight of copper decreased by etching, the specific gravity, and the surface area of the copper.

The microetching is also applied to remove oxidized films from the surface of copper prior to a solder leveling process or prior to mounting electronic parts in order to improve solderability. An aqueous solution containing sulfuric acid and hydrogen peroxide as major components or an aqueous solution containing persulfate as a major component is used for the microetching.

As the circuit density of printed wiring boards become higher, conventional heat curable solder resists are being replaced by UV curable solder resists which are superior in forming fine line patterns. The characteristics of the UV curable solder resists in adhering to copper surfaces, however, are weaker than those of conventional solder resists. The copper surfaces obtained by conventional microetching therefore exhibit insufficient adhesion to these UV curable solder resists. Resist films may be peeled or may swell during the subsequent steps of gold plating, solder leveling, or electronic part mounting.

The solderability of copper surfaces obtained by conventional microetching is also insufficient for the solder leveling process for printing wiring boards which has an increasing number of pads for surface mount devices. Soldering failures sometimes occur.

Therefore, development of a microetching agent which can produce roughened surfaces on copper or copper alloy with adequately deep irregularities exhibiting excellent adhesion of solder resists and the like has been desired.

The inventors of the present invention have undertaken extensive studies and found that the addition of an unsaturated carboxylic acid, a salt thereof, or an anhydride thereof to a microetching agent comprising nitric acid or sulfuric acid and ferric nitrate or ferric sulfate, can achieve this object.

SUMMARY OF THE INVENTION

Accordingly, an object of the present invention is to provide a microetching composition for copper or copper alloys comprising, (a) nitric acid or sulfuric acid, or both, (b) ferric nitrate or ferric sulfate, or both, (c) at least one component selected from a group consisting of unsaturated carboxylic acids, salts of unsaturated carboxylic acid, and anhydrides of unsaturated carboxylic acid, and (d) water.

Other objects, features and advantages of the invention will hereinafter become more readily apparent from the following description.

DETAILED DESCRIPTION OF THE INVENTION AND PREFERRED EMBODIMENTS

Either sulfuric acid or nitric acid, or both, may be used as the counter ion for dissolved copper. The amount of the acid, such as nitric acid, in the composition is in the range of 0.5 to 30% by weight (% by weight is hereinafter simply referred to as %), preferably 3 to 15%. If less than 0.5%, the absolute amount of the acid to the amount of the dissolved copper is insufficient, permitting only a limited amount of copper to be dissolved, although the microetching composition has capability of oxidizing copper surface. The amount exceeding 30%, on the other hand, does not give any additional effect proportionate to the increased amount of the acid and is thus uneconomical.

Ferric nitrate or ferric sulfate is used in the present invention to increase the etching speed. The amount of ferric nitrate or ferric sulfate to be added to the composition is in the range of 0.5 to 30%, and preferably 3 to 15%. If less than 0.5%, the required etching speed cannot be obtained; if more than 30%, production of noxious compounds, such as nitrogen oxide (when ferric nitrate is used), may be accelerated.

An unsaturated carboxylic acid, a salt of unsaturated carboxylic acid, or an anhydride of unsaturated carboxylic acid is added to the composition of the present invention to produce etching with deep irregularities on the surface of the copper. As the unsaturated carboxylic acid, water soluble unsaturated carboxylic acids, such as acrylic acid, methacrylic acid, crotonic acid, isocrotonic acid, maleic acid, fumaric acid, citraconic acid, itaconic acid, propiolic acid, tetrolic acid, and acetylene dicarboxylic acid, can be used. As the salts of these acids, sodium salt or potassium salt can be used. Maleic anhydride, itaconic anhydride, citraconic anhydride, and the like are given as examples of the anhydride of carboxylic acid used in the present invention.

These unsaturated carboxylic acids, salts, or anhydrides may be used either individually or in combinations of two or more in any optional proportion. The amount of these components incorporated into the composition of the present invention is in the range of 0.1 to 20%, preferably 1 to 10%. If this amount is less than 0. 1%, the capability of the composition to produce adequately roughened copper surface is insufficient. It is difficult to dissolve these components in water if the amount is more than 20%. In addition, the amount exceeding 20% does not give any additional effect proportionate to the increased amount and is thus uneconomical.

In addition to the above essential components, the microetching composition of this embodiment may be formulated with various other additives as required.

The microetching composition of the present invention can be prepared by adding the above-mentioned components in the proportions described above to water (d) and blending the mixture. There are no specific limitations to the method of addition. The components may be added either all at one time or separately in any arbitrary order.

There are no specific limitations to the method for using the microetching composition of the present invention. Examples of such a method include a method of spraying the composition onto the surfaces of copper or copper alloy to be treated, a method of immersing the copper or copper alloy in the composition, and the like.

The microetching composition of the present invention can be widely used for chemical cleaning or the like of copper or copper alloys. The resulting surfaces of the copper or copper alloy have adequate irregularities with deep convex and concave portions so that they can exhibit not only excellent adhesion to resins, such as prepregs, solder resists, dry film resists, and electrodeposition resists, but also superior solderability. Because of this, the microetching composition is particularly useful for the manufacture of various printed-wiring boards, including those for semiconductor packages, such as pin grid array (PGA) packages or ball grid array (BGA) packages. Further, in the manufacture of multilayered printed-wiring boards, the use of the microetching composition for roughening the copper surfaces of inner layers produces surfaces which exhibit not only excellent adhesion to prepregs, but also a superb effect in preventing formation of pink rings. In addition, the microetching composition is effective for the surface treatment of lead frames used for integrated circuit boards.

Other features of the invention will become apparent in the course of the following description of the exemplary embodiments which are given for illustration of the invention and are not intended to be limiting thereof.

EXAMPLES

Examples 1–6 and Comparative Examples 1–6

Microetching compositions of the present invention and comparative microetching compositions were prepared by mixing the components listed in Tables 1 and 2. The microetching compositions obtained were sprayed on the surface of copper-clad laminates for printed-wiring boards (FR-4) at 30° C. for 10 seconds to produce roughened surfaces. A solder resist, PSR-4000™ (manufactured by Taiyo Ink Co., Ltd.) was coated onto the treated surfaces, irradiated with light, developed, and post-cured.

The cured solder resist on the copper-clad laminate was cut into 1 mm×1 mm squares, dipped in a 3.5% aqueous solution of hydrochloric acid at room temperature (about 20° C.) for 10 minutes, washed with water, and dried according to JIS K 5400 8.5.2. Further, the peeling test according to the JIS K 5400 8.5.2 was carried out using a cellophane tape to evaluate the adhesion characteristics by observing the peeled off solder resist squares by the naked eye. The results were classified according to the following standard.

⊚ No solder resist whatsoever was attached to the cellophane tape.

○ A small number of solder resists were attached to the cellophane tape.

X A great number of resists were attached over a wide area of the cellophane tape.

The results are shown in Tables 1 and 2.

TABLE 1

| | Component | Weight % | Results |
|---|---|---|---|
| Example 1 | $HNO_3$ (67.5%) | 5 | |
| | $Fe(NO_3)_3.9H_2O$ | 15 | ○ |
| | Acrylic acid | 3 | |
| | Water | 77 | |
| Example 2 | $HNO_3$ (67.5%) | 15 | |
| | $Fe(NO_3)_3.9H_2O$ | 5 | ○ |
| | Maleic acid | 10 | |
| | Water | 70 | |
| Example 3 | $HNO_3$ (67.5%) | 10 | |
| | $Fe(NO_3)_3.9H_2O$ | 12 | ⊚ |
| | Itaconic acid | 3 | |
| | Water | 75 | |
| Example 4 | $HNO_3$ (67.5%) | 12 | |
| | $Fe(NO_3)_3.9H_2O$ | 10 | ○ |
| | Disodium fumarate | 5 | |
| | Water | 73 | |
| Example 5 | $HNO_3$ (67.5%) | 12 | |
| | $Fe(NO_3)_3.9H_2O$ | 12 | ○ |
| | Maleic anhydride | 5 | |
| | Water | 71 | |
| Example 6 | $H_2SO_4$ (62.5%) | 8 | |
| | $Fe_2(SO_4)_3.nH_2O$ | 10 | ○ |
| | Maleic anhydride | 5 | |
| | Water | 77 | |

TABLE 2

| | Component | Weight % | Results |
|---|---|---|---|
| Comparative | Sulfuric acid | 10 | |
| Example 1 | 35% $H_2O_2$ | 5 | X |
| | Water | 85 | |
| Comparative | Sodium persulfate | 10 | |
| Example 2 | Sulfuric acid | 1 | X |
| | Water | 89 | |
| Comparative | $HNO_3$ (67.5%) | 15 | |
| Example 3 | $Fe(NO_3)_3.9H_2O$ | 15 | X |
| | Water | 70 | |
| Comparative | $HNO_3$ (67.5%) | 12 | |
| Example 4 | $Fe(NO_3)_3.9H_2O$ | 12 | X |
| | Malonic acid | 5 | |
| | Water | 71 | |
| Comparative | $HNO_3$ (67.5%) | 12 | |
| Example 5 | $Fe(NO_3)_3.9H_2O$ | 12 | X |
| | Succinic anhydride | 3 | |
| | Water | 73 | |
| Comparative | $H_2SO_4$ (62.5%) | 8 | |
| Example 6 | $Fe_2(SO_4)_3.nH_2O$ | 10 | X |
| | Water | 82 | |

A surface exhibiting not only excellent adhesion to resins such as prepregs and resists, but also superior solderability can be obtained by treating the surface of copper or a copper alloy with the microetching composition of the present invention. Because the resulting surface is less glossy than that obtained using conventional microetching compositions, this microetching composition has the effect of improving resolution when used as the base for a photosensitive resin and of decreasing errors in the inspection of printed wiring boards using an automatic optical inspector (AOI). The microetching composition of the present invention is thus useful for the manufacture of printed wiring boards as the patterns are increasingly miniaturized and the circuit density becomes higher.

Obviously, numerous modifications and variations of the present invention are possible in light of the above teachings. It is therefore to be understood that, within the scope of the appended claims, the invention may be practiced otherwise than as specifically described herein.

What is claimed is:

1. A microetching composition for copper or copper alloys comprising as components, (a) nitric acid or sulfuric acid, or both, (b) ferric nitrate or ferric sulfate, or both, (c) at least one water soluble component selected from a group consisting of unsaturated aliphatic carboxylic acids, salts of unsaturated aliphatic carboxylic acids, and anhydrides of unsaturated aliphatic carboxylic acids, and (d) water.

2. The microetching composition for copper or copper alloys according to claim 1, which contains 0.5 to 30% by weight of component (a).

3. The microetching composition for copper or copper alloys according to claim 1, which contains 0.5 to 30% by weight of component (b).

4. A microetching composition for copper alloys comprising as components, (a) nitric acid or sulfuric acid, or both, (b) ferric nitrate or ferric sulfate, or both, (c) at least one component selected from a group consisting of unsaturated carboxylic acids, salts of unsaturated carboxylic acids, and anhydrides of unsaturated carboxylic acids, and (d) water, wherein the unsaturated carboxylic acids are selected from the group consisting of acrylic acid, methacrylic acid, crotonic acid, isocrotonic acid, maleic acid, fumaric acid, citraconic acid, itaconic acid, propionic acid, tetrolic acid, and acetylene dicarboxylic acid.

5. The microetching composition for copper or copper alloys according to claim 1, wherein the component (c) is a sodium salt or a potassium salt.

6. The microetching composition for copper or copper alloys according to claim 1, wherein the component (c) is maleic anhydride, itaconic anhydride, or citraconic anhydride.

7. The microetching composition for copper or copper alloys according to claim 1, which contains 0.1 to 20% by weight of the unsaturated carboxylic acids, the salts, or the anhydrides.

8. The microetching composition for copper or copper alloys according to claim 2, which contains 0.1 to 20% by weight of the unsaturated carboxylic acids, the salts, or the anhydrides and 0.5 to 30% by weight of component (b).

* * * * *